United States Patent
Hori

(10) Patent No.: US 11,601,319 B2
(45) Date of Patent: Mar. 7, 2023

(54) DIGITAL MODULATOR, COMMUNICATION DEVICE, AND DIGITAL MODULATOR CONTROL METHOD

(71) Applicant: NEC Corporation, Tokyo (JP)

(72) Inventor: Shinichi Hori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/577,792

(22) Filed: Jan. 18, 2022

(65) Prior Publication Data

US 2022/0239544 A1 Jul. 28, 2022

(30) Foreign Application Priority Data

Jan. 27, 2021 (JP) .............................. JP2021-010815

(51) Int. Cl.
| | |
|---|---|
| H04L 27/36 | (2006.01) |
| H04L 1/00 | (2006.01) |
| H03F 1/32 | (2006.01) |

(52) U.S. Cl.
CPC ......... *H04L 27/361* (2013.01); *H03F 1/3247* (2013.01); *H04L 1/0071* (2013.01); *H03F 2200/102* (2013.01)

(58) Field of Classification Search
CPC .............. H03C 1/06; H03C 1/62; H03C 3/04; H03C 3/08; H03C 3/40; H03C 5/00; H03F 1/3241; H03F 1/3247; H03F 2200/102; H04L 1/0071; H04L 27/04; H04L 27/20; H04L 27/34; H04L 27/36; H04L 27/361; H04L 27/365

USPC .............. 375/268, 284, 296, 297, 300, 308; 332/103, 145, 149, 159; 455/63.1, 108, 455/110, 114.3

See application file for complete search history.

(56) References Cited

U.S. PATENT DOCUMENTS

| | | | | |
|---|---|---|---|---|
| 7,787,563 | B2* | 8/2010 | Tal | H03M 7/3017 375/297 |
| 8,831,085 | B2* | 9/2014 | Hezar | H04L 1/0071 375/295 |
| 9,166,539 | B2* | 10/2015 | Hori | H03F 3/217 |
| 9,590,663 | B2* | 3/2017 | Aono | H03F 3/24 |
| 2016/0248470 | A1* | 8/2016 | Kunihiro | H03F 3/213 |

FOREIGN PATENT DOCUMENTS

JP 2020-167465 A 10/2020

* cited by examiner

*Primary Examiner* — Young T. Tse

(57) ABSTRACT

A digital modulator according to the present disclosure includes a polar converter that generates a phase signal and an amplitude signal from a baseband signal, an RF phase signal generator that generates an RF phase signal on the basis of the phase signal, a rectangulating unit that generates a rectangular RF phase signal by converting the RF phase signal into a rectangular shape, a time interleaver that time interleaves the amplitude signal and outputs first and second time interleaved signals, a $\Delta\Sigma$ modulator that $\Delta\Sigma$ modulates the first and second time interleaved signals on the basis of the rectangular RF phase signal and outputs first and second $\Delta\Sigma$ modulated signals, and a selector that selects and outputs one of the first and second $\Delta\Sigma$ modulated signals on the basis of the rectangular RF phase signal.

18 Claims, 16 Drawing Sheets

NON-TIME INTERLEAVING ΔΣ MODULATOR

PRIOR ART

DIGITAL MODULATOR, COMMUNICATION DEVICE, AND DIGITAL MODULATOR CONTROL METHOD

INCORPORATION BY REFERENCE

This application is based upon and claims the benefit of priority from Japanese patent application No. 2021-010815, filed on Jan. 27, 2021, the disclosure of which is incorporated herein in its entirety by reference.

TECHNICAL FIELD

The present disclosure relates to a digital modulator, a communication device, a digital modulator control method, and a program.

BACKGROUND ART

FIG. 11 shows a configuration of a radio access system using an optical fiber according to a related art. In an access network of a mobile network, the radio access system using an optical fiber as shown in FIG. 11 is separately placed as a system that supplies radio waves at low cost in places where radio waves from an outdoor base station are hard to reach, such as in an underground mall and inside a building, for example. In this system, a digital radio signal generated in a center unit is converted from parallel to serial and then transmitted through an optical fiber to a remote unit located in an area with weak signal. After that, in this remote unit, the signal is converted from serial to parallel, converted into an analog signal by a DAC (Digital-to-Analog Converter), and further converted into a high-frequency signal, and then emitted from an antenna.

FIG. 12 shows another configuration of a radio access system using an optical fiber according to a related art. The system shown in FIG. 12 converts a high-frequency radio signal into a 1-bit rectangular signal and transmits it to an extension unit (remote unit) directly through an optical fiber, and therefore a DAC is not needed in the extension unit. This can reduce the cost of the extension unit and enhance the efficiency, and can also facilitate installation. As a 1-bit transmission scheme configured at low cost, a phase-locked EDSM (Envelope Delta-Sigma Modulation), which is a phase-locked digital modulation scheme capable of generating rectangular waveforms at low rate, is effective.

SUMMARY

On the other hand, to handle 5G wideband signals, wider bandwidth communication is required. A bandwidth in the case of using the phase-locked digital modulation scheme is proportional to a clock frequency of a ΔΣ modulator included in a transmitter. In the case of using the phase-locked digital modulation scheme, a technique that oscillates a clock signal by using an RF phase signal is employed, and therefore the clock frequency is fixed to a carrier frequency. Thus, when the carrier frequency is not high enough, wider bandwidth communication is not achievable. Japanese Unexamined Patent Application Publication No. 2020-167465 discloses a technique related to a digital modulator that orthogonally modulates an N-valued digital signal by using a mixer and an adder.

However, in the digital modulator disclosed in Japanese Unexamined Patent Application Publication No. 2020-167465, the orthogonally modulated digital signal remains N-valued. Further, (N−1) number of binary signals, which are 1-bit parallel signals, are generated in an N-valued signal distributor after orthogonal modulation. This can cause design related to the configuration of the mixer and the like included in the digital modulator to be complicated.

In view of the above problem, an object of the present disclosure is to provide a digital modulator, a communication device, a digital modulator control method, and a program that achieve wider signal bandwidth with simple components.

A digital modulator according to the present disclosure includes a polar converter configured to generate a phase signal and an amplitude signal from a baseband signal; an RF phase signal generator configured to generate an RF phase signal on the basis of the phase signal; a rectangulating unit configured to generate a rectangular RF phase signal by converting the RF phase signal into a rectangular shape; a time interleaver configured to time interleave the amplitude signal, and output a first interleaved signal and a second time interleaved signal; a ΔΣ modulator configured to ΔΣ modulate the first interleaved signal and the second time interleaved signal on the basis of the rectangular RF phase signal, and output a first ΔΣ modulated signal and a second ΔΣ modulated signal; and a selector configured to receive as input the first ΔΣ modulated signal and the second ΔΣ modulated signal, and select and output one of the first ΔΣ modulated signal and the second ΔΣ modulated signal on the basis of the rectangular RF phase signal.

A communication device according to the present disclosure includes a digital modulator and an optical module configured to perform signal processing on the basis of an output signal of the digital modulator, wherein the digital modulator includes a polar converter configured to generate a phase signal and an amplitude signal from a baseband signal; an RF phase signal generator configured to generate an RF phase signal on the basis of the phase signal; a rectangulating unit configured to generate a rectangular RF phase signal by converting the RF phase signal into a rectangular shape; a time interleaver configured to time interleave the amplitude signal, and output a first interleaved signal and a second time interleaved signal; a ΔΣ modulator configured to ΔΣ modulate the first interleaved signal and the second time interleaved signal on the basis of the rectangular RF phase signal, and output a first ΔΣ modulated signal and a second ΔΣ modulated signal; and a selector configured to receive as input the first ΔΣ modulated signal and the second ΔΣ modulated signal, and select and output one of the first ΔΣ modulated signal and the second ΔΣ modulated signal on the basis of the rectangular RF phase signal.

A digital modulator control method according to the present disclosure includes a step of generating a phase signal and an amplitude signal from a baseband signal; a step of generating an RF phase signal on the basis of the phase signal; a step of generating a rectangular RF phase signal by converting the RF phase signal into a rectangular shape; a step of time interleaving the amplitude signal and outputting a first interleaved signal and a second time interleaved signal; a step of ΔΣ modulating the first interleaved signal and the second time interleaved signal on the basis of the rectangular RF phase signal and outputting a first ΔΣ modulated signal and a second ΔΣ modulated signal; and a step of inputting the first ΔΣ modulated signal and the second ΔΣ modulated signal and selecting and outputting one of the first ΔΣ modulated signal and the second ΔΣ modulated signal on the basis of the rectangular RF phase signal.

A program according to the present disclosure causes a digital modulator to perform processing of generating a phase signal and an amplitude signal from a baseband signal; processing of generating an RF phase signal on the basis of the phase signal; processing of generating a rectangular RF phase signal by converting the RF phase signal into a rectangular shape; processing of time interleaving the amplitude signal and outputting a first interleaved signal and a second time interleaved signal; processing of ΔΣ modulating the first interleaved signal and the second time interleaved signal on the basis of the rectangular RF phase signal and outputting a first ΔΣ modulated signal and a second ΔΣ modulated signal; and processing of inputting the first ΔΣ modulated signal and the second ΔΣ modulated signal and selecting and outputting one of the first ΔΣ modulated signal and the second ΔΣ modulated signal on the basis of the rectangular RF phase signal.

BRIEF DESCRIPTION OF DRAWINGS

The above and other aspects, features and advantages of the present disclosure will become more apparent from the following description of certain exemplary embodiments when taken in conjunction with the accompanying drawings, in which.

EMBODIMENTS

Hereinafter, example embodiments will be described with reference to the drawings. Since the drawings are simplified, the technical scope of the example embodiments should not be narrowly interpreted on the basis of the description of the drawings. The same elements are denoted by the same reference signs, and repeated descriptions are omitted.

The disclosure will be described by dividing it into a plurality of sections or example embodiments when needed for the sake of convenience in the following example embodiments. However, unless otherwise particularly specified, these sections or example embodiments are not irrelevant to one another, and one section or example embodiment is related to a modified example, an application, details, supplementary explanation and so on of some or all of the other ones. When reference is made to the number of elements and so on (including the number of pieces, numerical values, quantity, range, etc.) in the following example embodiments, the number thereof is not limited to a specific number and may be greater than or less than or equal to the specific number unless otherwise particularly specified and definitely limited to the specific number in principle.

Further, in the following example embodiments, components (including operation steps, etc.) are not always essential unless otherwise particularly specified and considered to be definitely essential in principle. Similarly, when reference is made to the shapes, positional relations and so on of the components or the like in the following example embodiments, they will include ones that are substantially approximate or similar to their shapes and so on unless otherwise particularly specified and considered to be definitely not applicable in principle. The same applies to the above-described number and so on (including the number of pieces, numerical values, quantity, range, etc.).

<Study Behind Accomplishment of Digital Modulator According to Example Embodiment>

Figure 12:
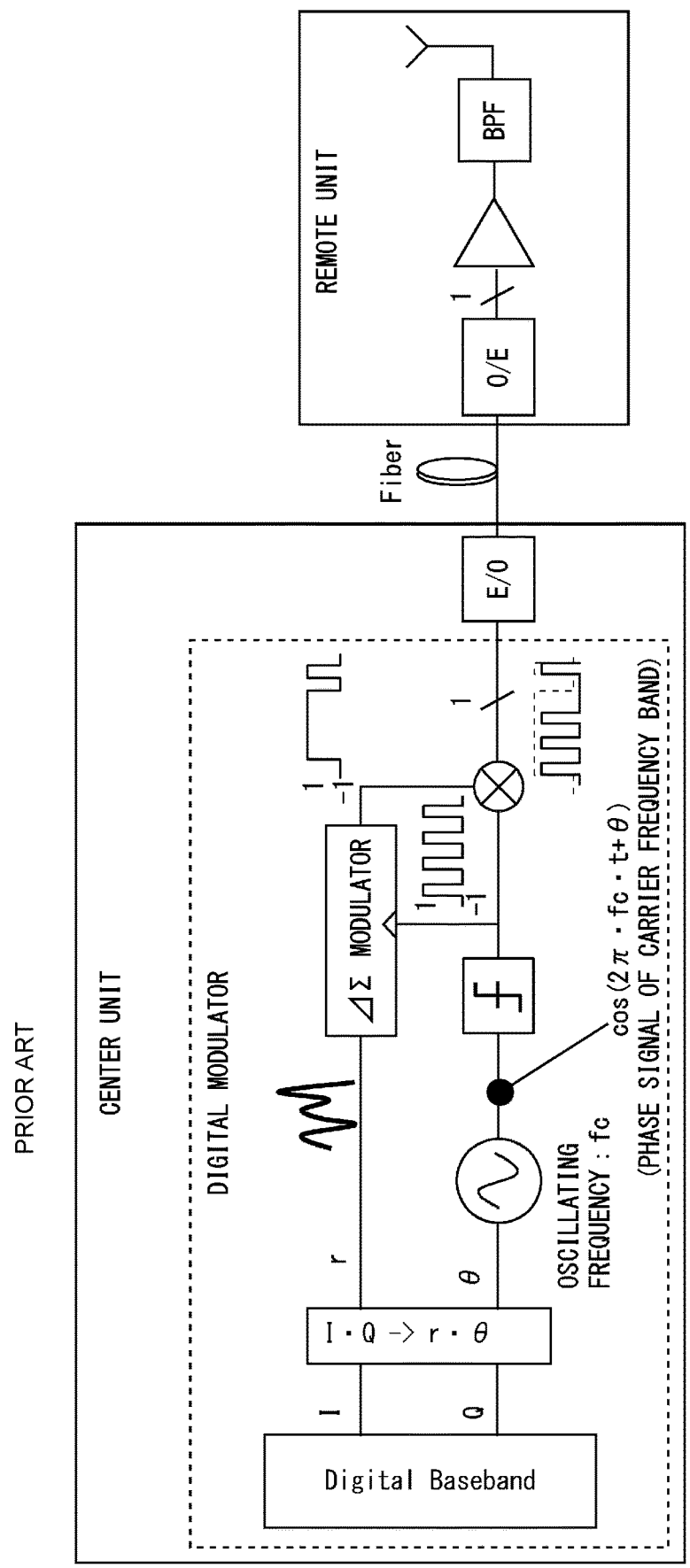
FIG. 12 is another block diagram of a radio access system using an optical fiber according to a related art.

As described earlier, the communication device (center unit) in the related system shown in FIG. 12 uses a ΔΣ modulator. By making the ΔΣ modulator operate at a rate sufficiently higher than an input signal frequency, quantization noise that occurs when binarizing an input signal is significantly reduced near a desired bandwidth. In FIG. 12, since a phase signal is used as a clock signal of the ΔΣ modulator, a clock rate is fc.

Figure 13:
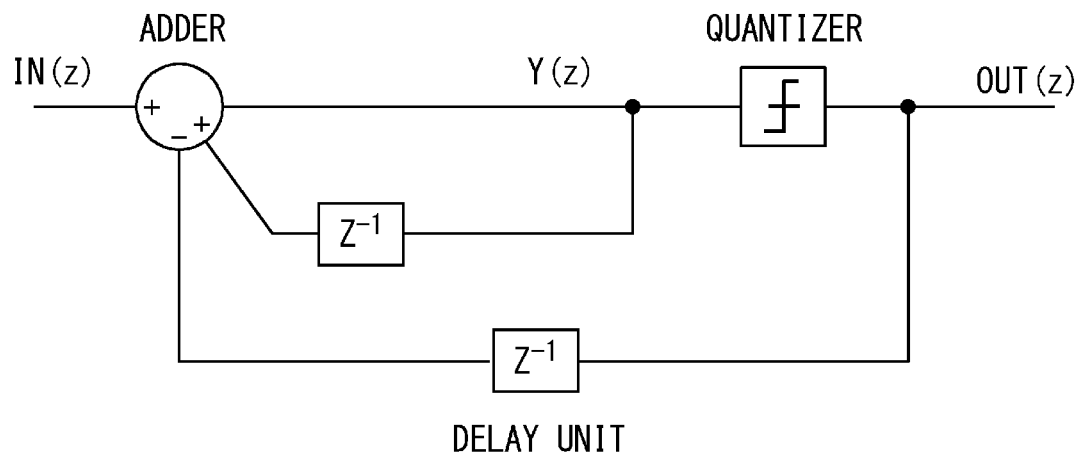
FIG. 13 is a block diagram of a ΔΣ modulator according to a related art.

FIG. 13 shows the configuration of a ΔΣ modulator according to a related art. The ΔΣ modulator includes an adder, a delay unit, and a comparator (quantizer), and a transfer function is represented by the following expression (1) where IN(z) is an input signal and OUT(z) is an output signal. Note that N(z) is quantization noise that occurs in the comparator. f is a signal frequency. $f_S$ is the operating frequency of this ΔΣ modulator.

Expression 1

$$\text{Out}(z) = \text{In}(z) + (1-z^{-1})N(z)$$

$$z = \exp(2\pi j f / f_S) \quad (1)$$

As shown in the expression (1), the quantization noise N(z) is multiplied by $(1-z^{-1})$ as a coefficient. This means that as the operating speed $f_S$ of the ΔΣ modulator is higher compared to the frequency domain f of an input signal, $z^{-1}$ approaches 1, a noise component contained in an output signal is reduced, and the signal-to-noise ratio (SNR) is improved.

On the other hand, a 1-bit signal generated in a digital modulator is generated by integration of a phase signal and an output signal of the ΔΣ modulator. Since an RF phase signal is a sinusoidal signal with a carrier frequency of fc that has been converted into a rectangular shape, it transitions alternately between low level and high level fc times per second. Thus, a data rate is 2 fc.

In the communication device shown in FIG. 12, when the signal bandwidth is $f_{bw}$, the SN ratio is a value obtained by substituting $f_{bw}$ for f and substituting fc for fs in the expression (1). If the signal bandwidth is increased with the carrier frequency remaining the same, noise component $(1-z^{-1}) \cdot N(z)$ increases with an increase in the absolute value of the coefficient $(1-z^{-1})$ of N(z), which degrades the SN ratio. Thus, the communication device shown in FIG. 12 is unable to achieve wider signal bandwidth without degradation of the SN ratio.

Figure 14:
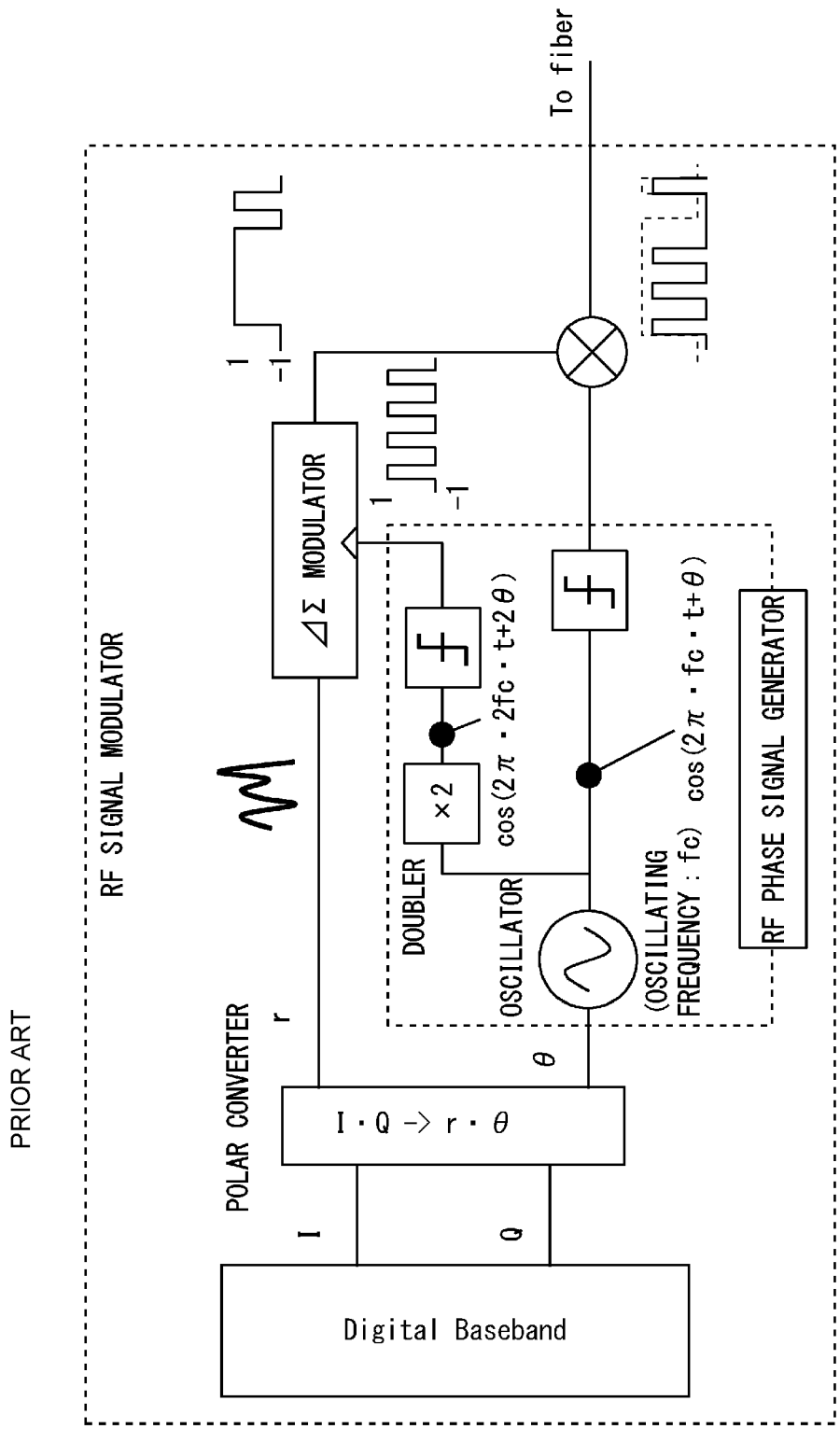
FIG. 14 is a block diagram of an RF signal modulator according to a related art.

FIG. 14 is a block diagram of an RF signal modulator according to a related art. In the RF signal modulator shown in FIG. 14, an output of a doubler to which a phase signal is input is used as a clock signal of the ΔΣ modulator, so that double wideband characteristics are achieved. However, since the doubler costs high and the ΔΣ modulator needs to operate at a double clock rate, this further increases the cost of manufacturing the ΔΣ modulator.

Figure 15:
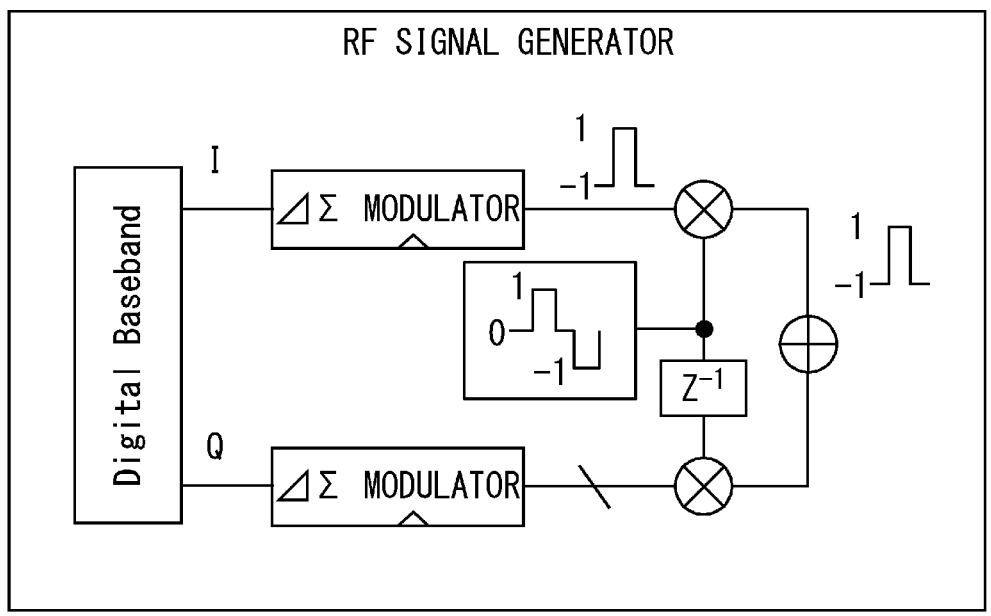
FIG. 15 is a block diagram of an RF signal generator according to a related art.

FIG. 15 is a block diagram of an RF signal generator according to a related art. In the RF signal generator shown in FIG. 15, since the clock rate of the ΔΣ modulator is 2 fc, the SN ratio is high, and wider signal bandwidth is achieved. However, the signal rate is 4 fc, which is double the signal rate in the communication device shown in FIG. 12, required characteristics to an optical module to be used for E/O and O/E converters become more severe, which further increases the cost of manufacture.

The digital modulator according to the present disclosure has been accomplished to solve the problems of the related arts described above. Example embodiments of the digital modulator according to the present disclosure are described hereinafter.

First Example Embodiment

Figure 1:
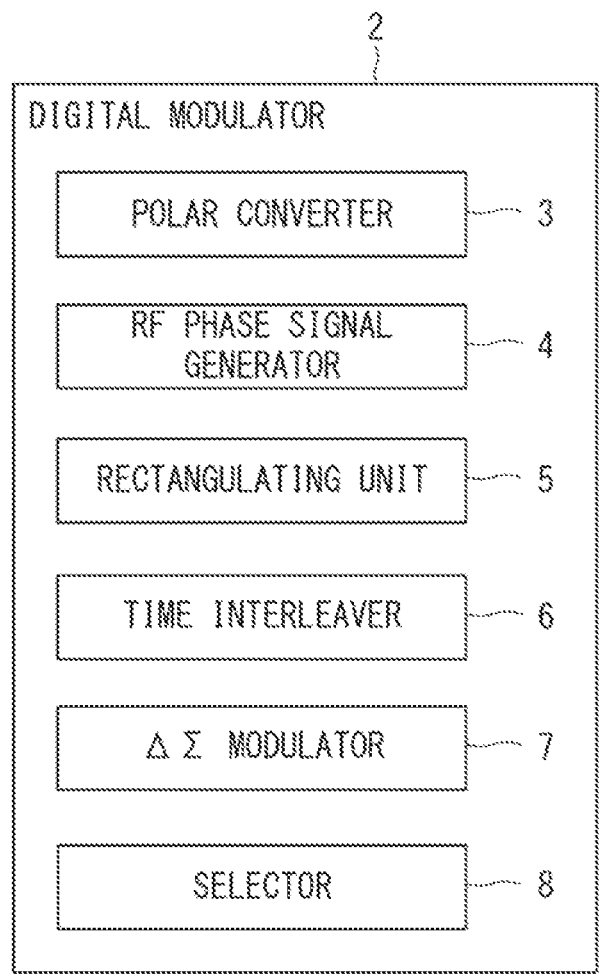
FIG. 1 is a block diagram of a digital modulator according to a first example embodiment of the present disclosure.

A digital modulator 2 according to a first example embodiment is described hereinafter with reference to FIG. 1. FIG. 1 is a view showing the configuration of the digital modulator 2 according to this example embodiment.

The digital modulator 2 includes a polar converter 3, an RF phase signal generator 4, a rectangulating unit 5, a time interleaver 6, a ΔΣ modulator 7, and a selector 8.

The polar converter 3 generates a phase signal and an amplitude signal from a baseband signal. The RF phase signal generator 4 generates an RF phase signal on the basis of the phase signal. The rectangulating unit 5 converts the RF phase signal into a rectangular shape and thereby generates a rectangular RF phase signal.

The time interleaver 6 time interleaves the amplitude signal, and outputs a first interleaved signal and a second time interleaved signal. Further, the ΔΣ modulator 7 performs ΔΣ modulation of the first interleaved signal and the second time interleaved signal on the basis of the rectangular RF phase signal, and thereby outputs a first ΔΣ modulated signal and a second ΔΣ modulated signal.

The selector 8 receives as input the first ΔΣ modulated signal and the second ΔΣ modulated signal, and selects and outputs any one of the first ΔΣ modulated signal and the second ΔΣ modulated signal on the basis of the rectangular RF phase signal.

The digital modulator 2 according to this example embodiment achieves wider signal bandwidth with simple components.

Second Example Embodiment

Figure 2:
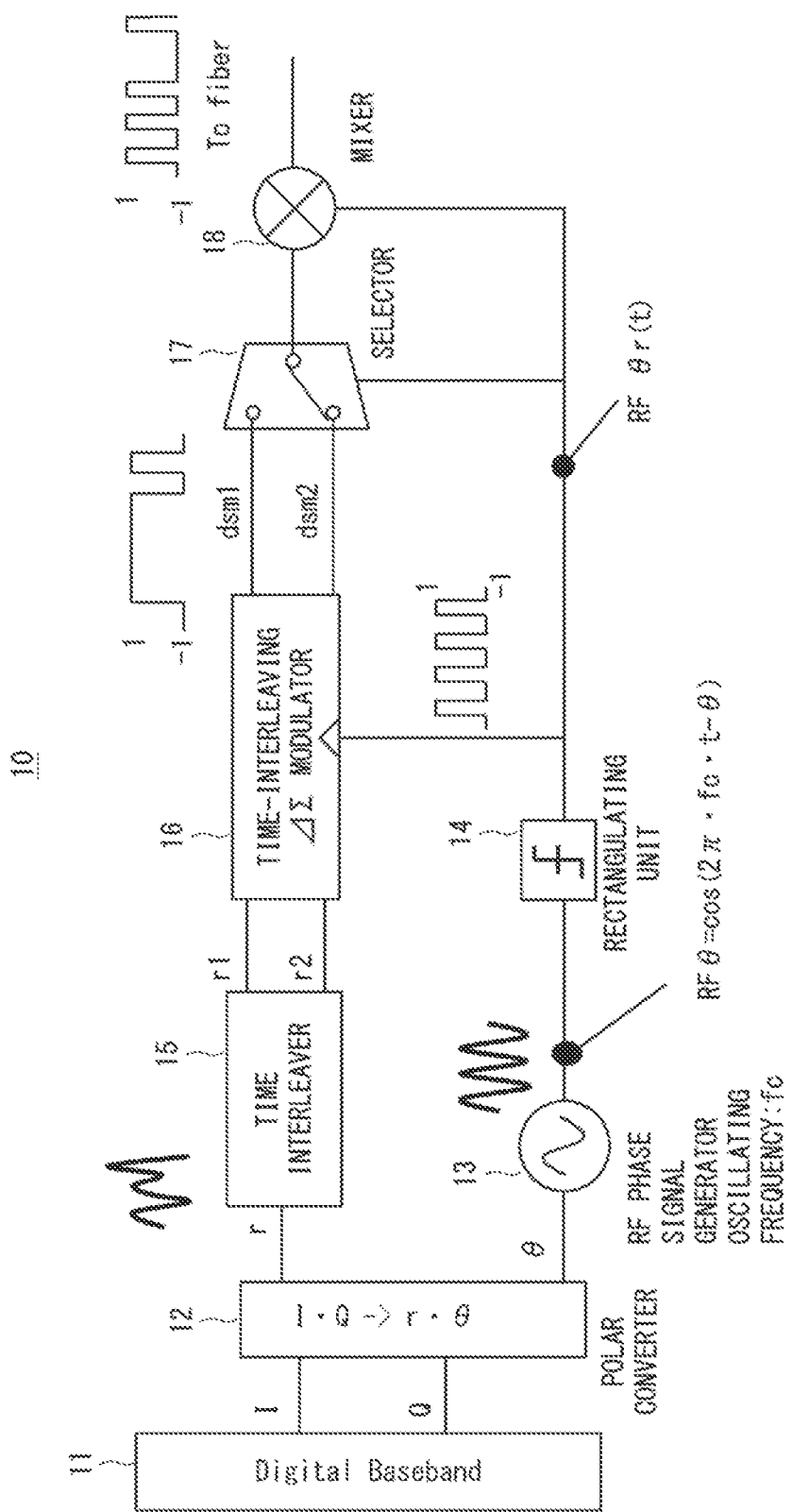
FIG. 2 is a block diagram of a digital modulator according to a second example embodiment of the present disclosure.

A digital modulator 10 according to a second example embodiment is described hereinafter with reference to FIG. 2. FIG. 2 is a block diagram of the digital modulator 10 according to this example embodiment.

The digital modulator 10 according to this example embodiment includes a baseband signal generating unit 11, a polar converter 12, an RF phase signal generator 13, a rectangulating unit 14, a time interleaver 15, a time interleaving ΔΣ modulator 16, a selector 17, and a mixer 18. The time interleaving ΔΣ modulator 16 may be simply referred to as a ΔΣ modulator. Further, the mixer 18 may be referred to as a multiplier.

The baseband signal generating unit 11 generates orthogonally modulated signals (I(t), Q(t)), which are radio baseband signals. The baseband signal generating unit 11 outputs the generated orthogonally modulated signals (I(t), Q(t)) to the polar converter 12. The orthogonally modulated signals (I(t), Q(t)) generated in the baseband signal generating unit 11 are converted into an amplitude signal r(t) and a phase signal θ(t) by the following expressions (2) and (3) in the polar converter 12.

Expression 2

$$r(t) = \sqrt{I^2(t) + Q^2(t)} \qquad (2)$$

Expression 3

$$\theta(t) = \tan^{-1}\frac{Q(t)}{I(t)} \qquad (3)$$

The phase signal is used as a phase control signal of the RF phase signal generator 13, and the output of the RF phase signal generator 13 is an RF phase signal RFθ(t) as represented by the following expression (4), where fc is a carrier frequency.

Expression 4

$$RF\theta(t) = \cos(2\pi f_c t - \theta) \qquad (4)$$

A desired radio signal RF(t) with the carrier frequency fc is generally described by the following expression (5) by using the orthogonally modulated signals I(t) and Q(t).

Expression 5

$$RF(t) = I(t)\cos(2\pi f_c t) + Q(t)\sin(2\pi f_c t) \qquad (5)$$

The expression (5) is described by the following expression (6) with use of the amplitude signal r(t) and the phase signal θ(t) after polar conversion.

Expression 6

$$RF(t) = r(t)\cos(2\pi f_c t - \theta(t)) \qquad (6)$$
$$= r(t)RF\theta(t)$$

The RF phase signal RFθ(t) is converted into a rectangular shape by the rectangulating unit 14 using zero comparison, and a rectangular RF phase signal RFθr(t) is thereby generated. The rectangular RF phase signal is, on the basis of an oscillating signal serving as a reference for an oscillating frequency generated by the RF phase signal generator 13 and the phase signal, a rectangular wave having a phase difference and an oscillating frequency, where the phase difference from the oscillating signal is equal to a phase indicated by the phase signal. RFθr(t) is used as a clock signal of the time interleaving ΔΣ modulator 16, which is described later, a control signal of the selector 17, and a second input signal of the mixer 18. Since RFθr(t) is the sum of RFθ(t) and harmonics Hm(t) generated when converting RFθ(t) into a rectangular shape, it is RFθ(t)+Hm(t).

Figure 3:
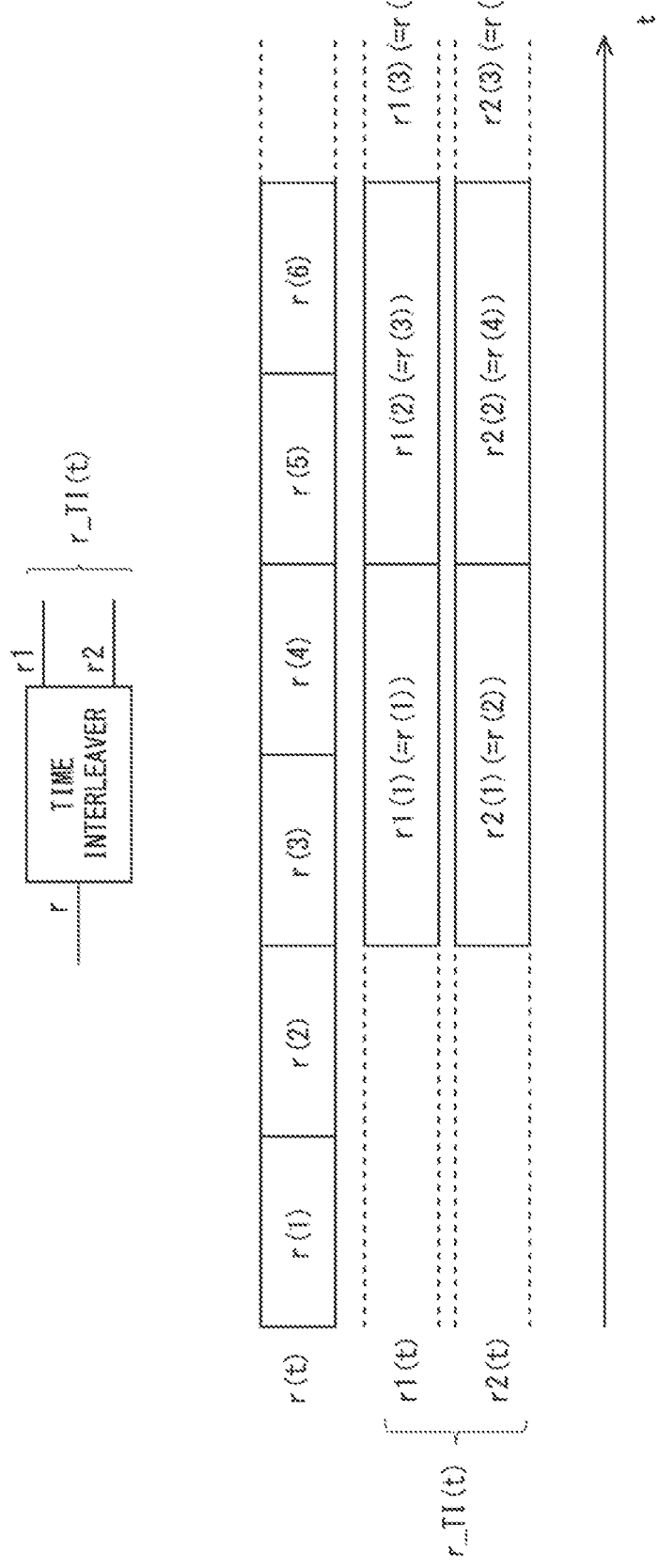
FIG. 3 is a time chart of a time interleaved amplitude signal according to the second example embodiment of the present disclosure.

FIG. 3 is a time chart of the time interleaver 15 according to this example embodiment. The time interleaver 15 time interleaves the amplitude signal r(t) and thereby generates a time interleaved amplitude signal r_TI(t). r_TI(t) treats previous and subsequent data of the amplitude signal r(t) in the time axis as one set. To be specific, as shown in FIG. 3, as element data of r_TI(t), immediately previous data is denoted as r1(t), and immediately subsequent data is denoted as r2(t). The element data at a k-th sampling point are r1(k)=r(2k−1) and r2 (k)=r(2k).

Figure 4A:
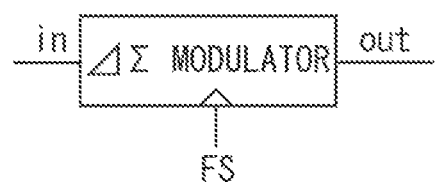
FIG. 4A is a block diagram of a non-time interleaving ΔΣ modulator according to a related art.
Figure 4A:
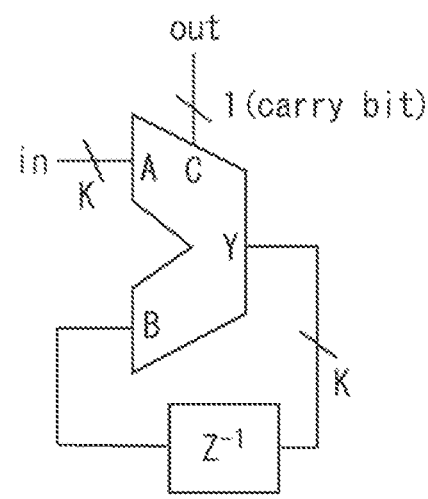
Figure 4B:
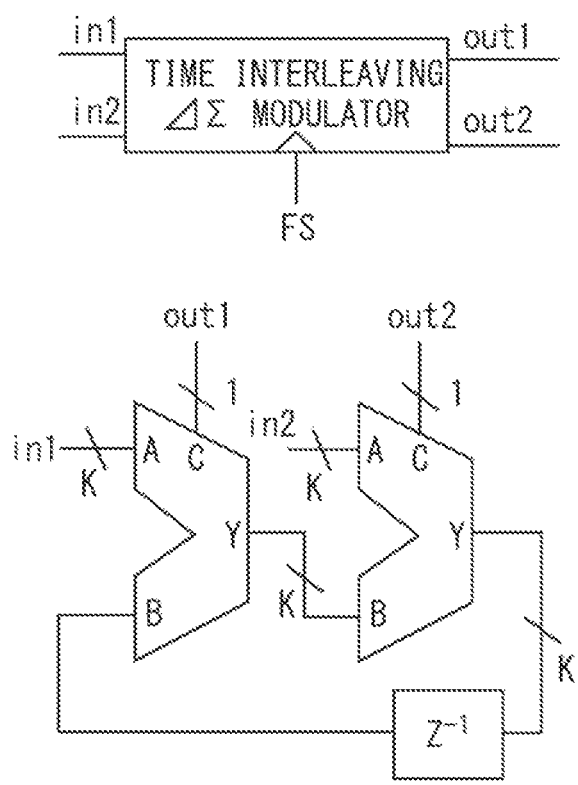
FIG. 4B is a block diagram of a time interleaving ΔΣ modulator according to the second example embodiment of the present disclosure.
Figure 5:
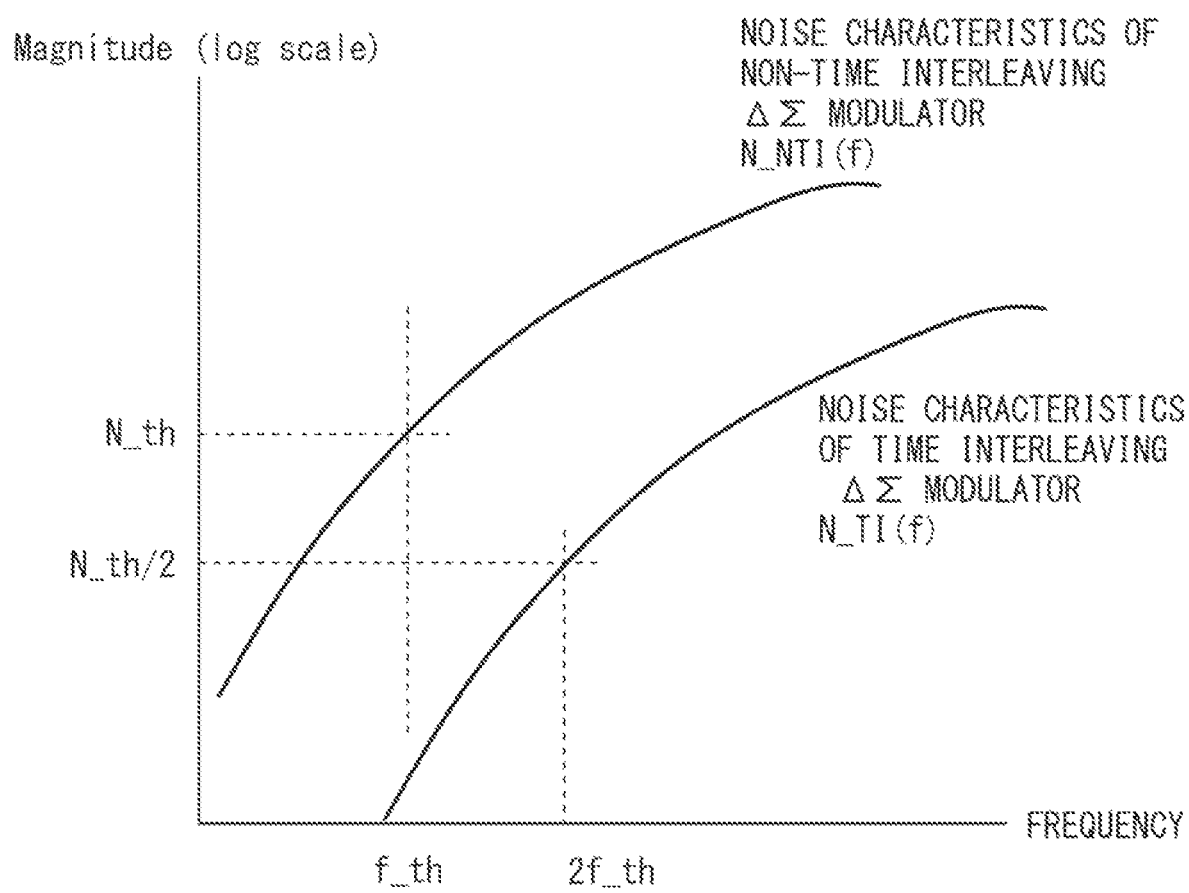
FIG. 5 is a view showing noise characteristics of the time interleaving ΔΣ modulator according to the second example embodiment of the present disclosure.

The time interleaving ΔΣ modulator 16 performs ΔΣ modulation of the time interleaved amplitude signal r_TI(t) by using the rectangular RF phase signal as a clock signal. FIG. 4A shows the configuration of a non-time interleaving ΔΣ modulator according to a related art, and FIG. 4B shows the configuration of the time interleaving ΔΣ modulator 16 according to this example embodiment. FIG. 5 shows noise characteristics of the non-time interleaving ΔΣ modulator according to a related art and the time interleaving ΔΣ modulator 16 according to the example embodiment.

In the logical units of FIGS. 4A and 4B, K-bit (digital signal) are input to input units A and B, an output unit C outputs a carry bit (most significant bit) of A+B, and an output unit Y outputs remaining bits (K bits) after removing the carry bit of A+B. The time interleaving ΔΣ modulator 16 implements time interleaving by combining two logical units in the non-time interleaving ΔΣ modulator.

Input signals in1(t) and in2(t) and output signals out1(t) and out2(t) in the time interleaving ΔΣ modulator 16 are time interleaved signals. The relationship with non-time interleaved signals in(t) and out(t) is in1(k)=in(2k−1), in2(t)=in(2k), out1(k)=out(2k−1), and out2(k)=out(2k), respectively.

When the input signals and the output signals of the time interleaving ΔΣ modulator 16 after z conversion are denoted as in(z) and out(z), respectively, the following relational expression (7) is established as a primary ΔΣ modulator.

Expression 7

$$\text{out}(z) = n(z) + (1-z^{-1})N_q(z) \quad (7)$$

A variable z is $z=\exp(2\pi j*f/fs)$ where f is a frequency, fs is a sampling frequency, and j is an imaginary number. In this configuration, the sampling frequency is 2fs, which is effectively double. Thus, z is represented by the following expression (8).

Expression 8

$$z = \exp(\pi j f/f_s) \quad (8)$$

Nq(z) is quantization noise generated inside the ΔΣ modulator, and it is white noise whose level does not have frequency dependence. The second term in the right-hand side of the expression (7) related to out(z) is frequency characteristics N_TI of noise of the time interleaving ΔΣ modulator 16 shown in FIG. 5. N_TI is represented by the following expression (9).

Expression 9

$$N\_TI(z) = (1-z^{-1})N_q(z)$$

$$z = \exp(\pi j f/f_s) \quad (9)$$

In the same manner, an output signal out_NT1(z) of the non-time interleaving ΔΣ modulator in FIG. 4A is described by the following expression (10). However, since the sampling frequency is effectively fs, the relational expression of z and f is different from that of the time interleaving ΔΣ modulator 16. Note that Nq_NT1(z) is quantization noise generated in the non-time interleaving ΔΣ modulator.

Expression 10

$$\text{out\_NTI}(z) = \text{in\_NTI}(z) + (1-z^{-1})N_q\_NTI(z)$$

$$z = \exp(2\pi j f/f_s) \quad (10)$$

The second term in the right-hand side of the expression (10) is described by the following expression (11) when it is represented as frequency characteristics N_NTI of noise of the non-time interleaving ΔΣ modulator as shown in FIG. 5.

Expression 11

$$N\_NTI(z) = (1-z^{-1})N_q\_NTI(z)$$

$$z = \exp(2\pi j f/f_s) \quad (11)$$

The quantization noise decreases in inverse proportion to the sampling frequency per unit frequency. Thus, the quantization noise generated in the time interleaving ΔΣ modulator 16 is half the quantization noise generated in the non-time interleaving ΔΣ modulator, and it is represented by Nq(z)=Nq_NTI(z)/2.

As described above, the effective sampling frequency of the time interleaving ΔΣ modulator 16 is 2 fs, and the effective sampling frequency of the non-time interleaving ΔΣ modulator is fs, which is half the above value. Thus, the following expression (12) is established.

Expression 12

$$|N\_TI(f)| = |N\_NTI(f/2)|/2 \quad (12)$$

According to the expression (12), noise characteristics of the non-time interleaving ΔΣ modulator that are doubled in the x-axis (frequency axis) and reduced to half in the y-axis (magnitude axis) coincide with noise characteristics of the time interleaving ΔΣ modulator 16. For example, as shown in FIG. 5, when noise of the non-time interleaving ΔΣ modulator at frequency f_th is N_th, noise of the time interleaving ΔΣ modulator 16 at frequency 2 f_th is N_th/2.

When the amount obtained by integrating the noise characteristics from 0 to f using the frequency component is defined as integral noise, and the integral noise of the non-time interleaving ΔΣ modulator and the integral noise of the time interleaving ΔΣ modulator 16 are INT_N_NTI(f) and INT_N_TI(f), respectively, the following expression (13) is established.

Expression 13

$$\text{INT}\_N\_TI(f) = \text{INT}\_N\_NTI(f/2) \quad (13)$$

According to the expression (13), a bandwidth where the integral noise reaches a certain level in the time interleaving ΔΣ modulator 16 is double that in the non-time interleaving ΔΣ modulator. The operating bandwidth of the ΔΣ modulator is defined as a bandwidth where the integral noise reaches any predetermined value. Thus, the bandwidth of the time interleaving ΔΣ modulator 16 is double that of the non-time interleaving ΔΣ modulator.

Figure 6:
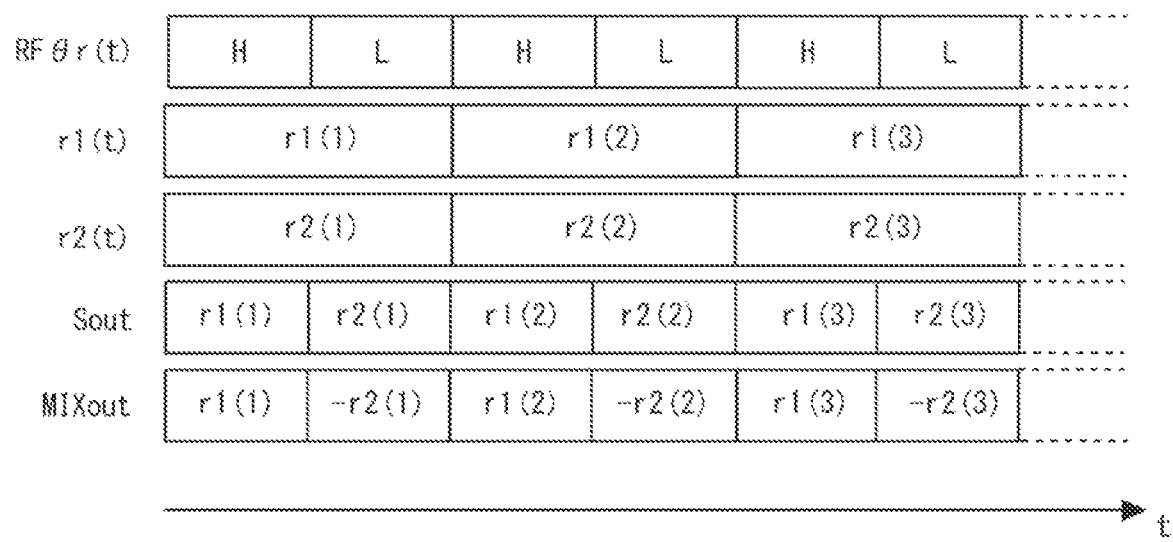
FIG. 6 is a time chart of a selector and a mixer according to the second example embodiment of the present disclosure.

The operation of the selector 17 and the mixer 18 is described hereinafter with reference to FIG. 6. FIG. 6 is a time chart of the selector 17 and the mixer 18 in the subsequent stage according to this example embodiment.

A time interleaved output signal of the time interleaving ΔΣ modulator 16 is input to the selector 17. An element signal r1(*t*) of the time interleaved signal is input to a first input terminal of the selector 17, and an element signal r2(*t*) of the time interleaved signal is input to a second input terminal of the selector 17. A rectangular RF phase signal RFθr(t) is input to a control terminal of the selector 17.

When a high signal is input to the control terminal, the selector 17 outputs the signal input to the first input terminal from its output terminal, and when a low signal is input to the control terminal, the selector 17 outputs the signal input to the second input terminal from its output terminal. The output signal of the selector 17 is a non-time interleaved signal. Note that, since the time interleaving ΔΣ modulator 16 in the previous stage operates in synchronization with the rectangular RF phase signal, the sampling frequency, i.e., the data rate, is fc. On the other hand, since the selector 17 operates to select output data depending on whether the rectangular RF phase signal is high level or low level, the data rate is 2 fc.

The mixer 18 in the subsequent stage of the selector 17 carries out a multiplication of a first input signal that is input to its first input terminal and a second input signal that is input to its second input terminal. The first input signal is the output signal selected by the selector 17, and the second input signal is the rectangular RF phase signal. In the mixer 18, a high signal is assigned as +1, and a low signal is assigned as −1 in the rectangular RF phase signal.

The output signal of the selector 17 corresponds to a signal obtained by converting the time interleaved signal output from the time interleaving ΔΣ modulator 16 into a non-time interleaved signal. When the amplitude signal is r(t), and the noise signal added by the ΔΣ modulator is N_TI(t), an output signal Sout(t) from the selector 17 is described by the following expression (14).

Expression 14

$$Sout(t)=r(t)+N\_TI(t) \quad (14)$$

Since MIXout(t) that is output from the mixer 18 is a multiplication value of Sout(t) and RFθr(t), it is described by the following expression (15).

Expression 15

$$MIXout(t) = \{r(t) + N\_TI(t)\}RF\theta r(t) \quad (15)$$
$$= RF(t) + r(t)Hm(t) + N\_TI(t)RF\theta r(t)$$

As shown in the expression (15), the output signal MIXout(t) of the mixer 18 contains a radio signal RF(t). The waveform of the output signal of the mixer 18 is rectangular. In MIXout(t), since Hm(t) is a signal having a peak at an integral multiple of the carrier frequency fc, the product r(t)·Hm(t) of Hm(t) and the amplitude signal r(t) also has a peak at an integral multiple of the carrier frequency fc in general. Since a desired signal is near fc, the peak component of r(t)·Hm(t) is sufficiently removable by use of a filter for high frequencies without affecting the desired signal. Thus, N_TI(t)·RFθr(t) is a dominant element as a noise component near fc. N_TI(t) is noise characteristics of the ΔΣ modulator, and when the specification of signal-to-noise characteristics is given, the noise characteristics N_TI(t) needs to be within a value satisfying the specification in the operable bandwidth.

As described above, the bandwidth that satisfies the specification in the noise characteristics of the time interleaving ΔΣ modulator 16 is double that when using the non-time interleaving ΔΣ modulator.

In this example embodiment using the time interleaving ΔΣ modulator 16, the operating bandwidth is double that when using the non-time interleaving ΔΣ modulator while the clock is still fc.

The digital modulator 10 according to this example embodiment allows wider signal bandwidth to be achieved without degradation of the SN ratio. Further, the digital modulator 10 allows costs to be reduced without the clock rate of the ΔΣ modulator exceeding fc.

Third Example Embodiment

Figure 7:
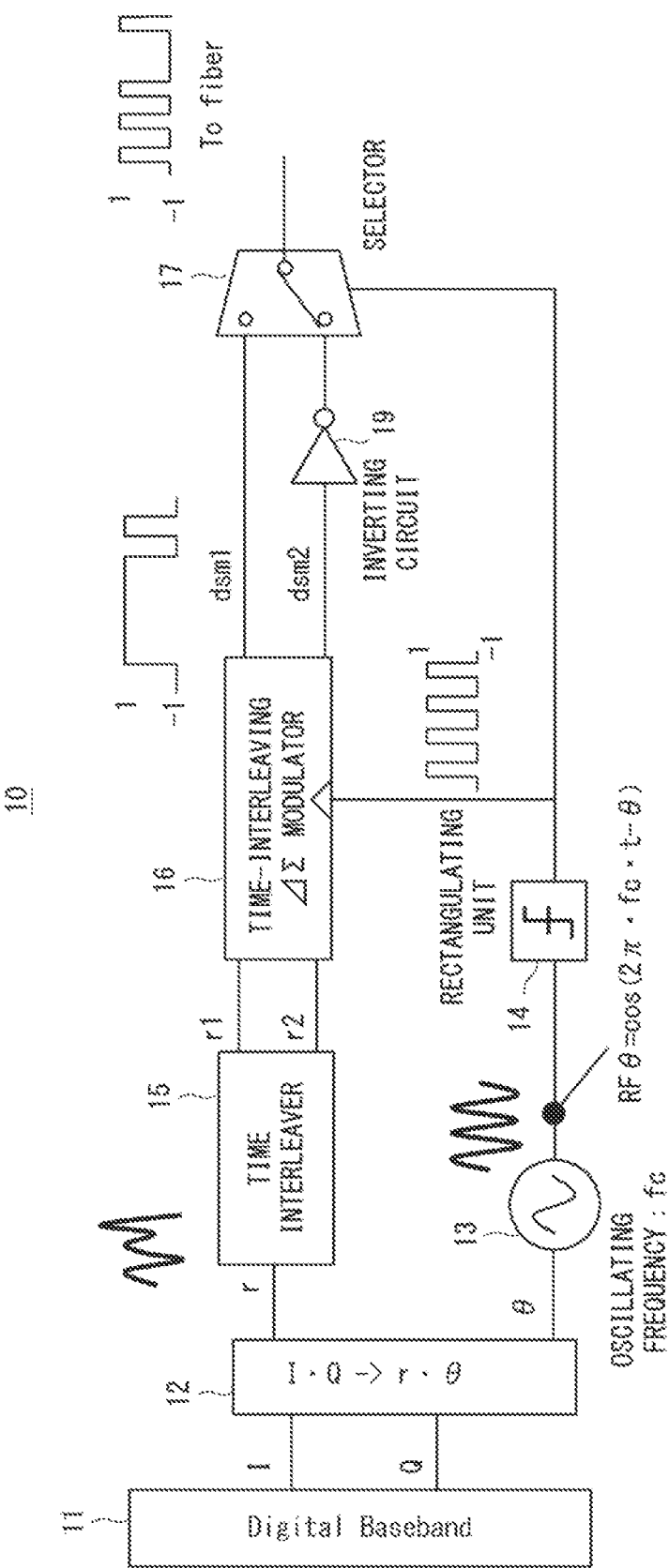
FIG. 7 is a block diagram of a digital modulator according to a third example embodiment of the present disclosure.

A digital modulator 10 according to a third example embodiment is described hereinafter with reference to FIG. 7. FIG. 7 is a block diagram of the digital modulator 10 according to this example embodiment.

The digital modulator 10 according to this example embodiment includes a baseband signal generating unit 11, a polar converter 12, an RF phase signal generator 13, a rectangulating unit 14, a time interleaver 15, a time interleaving ΔΣ modulator 16, a selector 17, and an inverting circuit 19.

The baseband signal generating unit 11, the polar converter 12, the RF phase signal generator 13, the rectangulating unit 14, the time interleaver 15, the time interleaving ΔΣ modulator 16, and the selector 17 are the same as those of the second example embodiment, and the detailed description thereof is omitted.

A difference from the second example embodiment is a subsequent stage in the time interleaving ΔΣ modulator 16. One element signal in an output signal of the time interleaving ΔΣ modulator 16 is inverted by the inverting circuit 19 and input to the selector 17. An output signal of the selector 17 is an output signal in this example embodiment.

Figure 8:
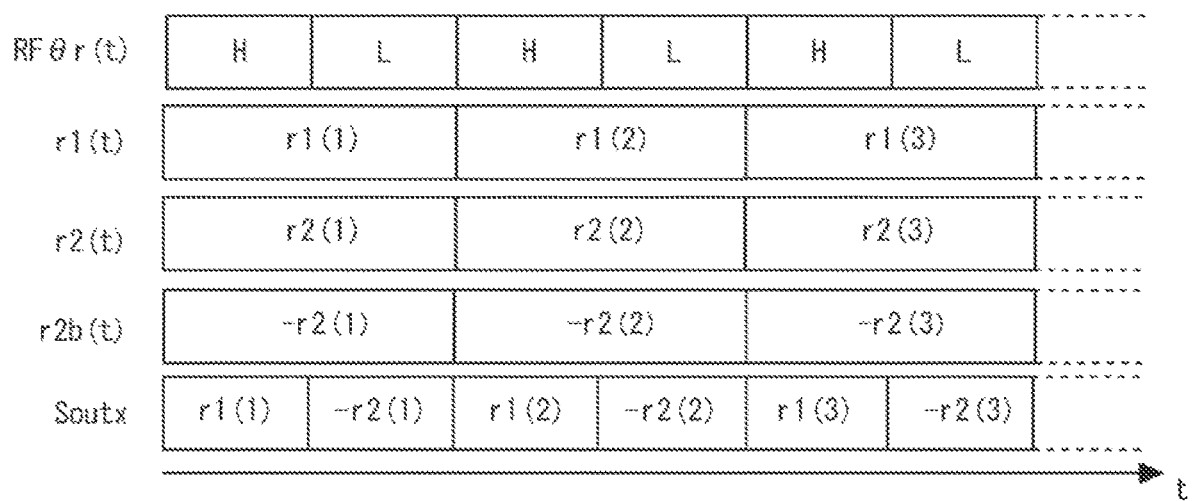
FIG. 8 is a time chart of a selector according to the third example embodiment of the present disclosure.

FIG. 8 is a time chart of the selector 17 according to this example embodiment. In FIG. 8, an output of the selector 17 according to this example embodiment is Soutx, a first input signal of the selector 17 is r1(*t*), and a second input signal is r2*b*(t), which is an inverted signal of r2(*t*).

As shown in the time chart of FIG. 8, Soutx in this example embodiment coincides with the output signal MIXout of the mixer 18 in the second example embodiment. This means that signal processing in this example embodiment is equal to signal processing in the second example embodiment. Further, since the mixer 18 is not needed in this example embodiment, differently from the second example embodiment, it is implementable with a simple circuit configuration.

Fourth Example Embodiment

Figure 9:
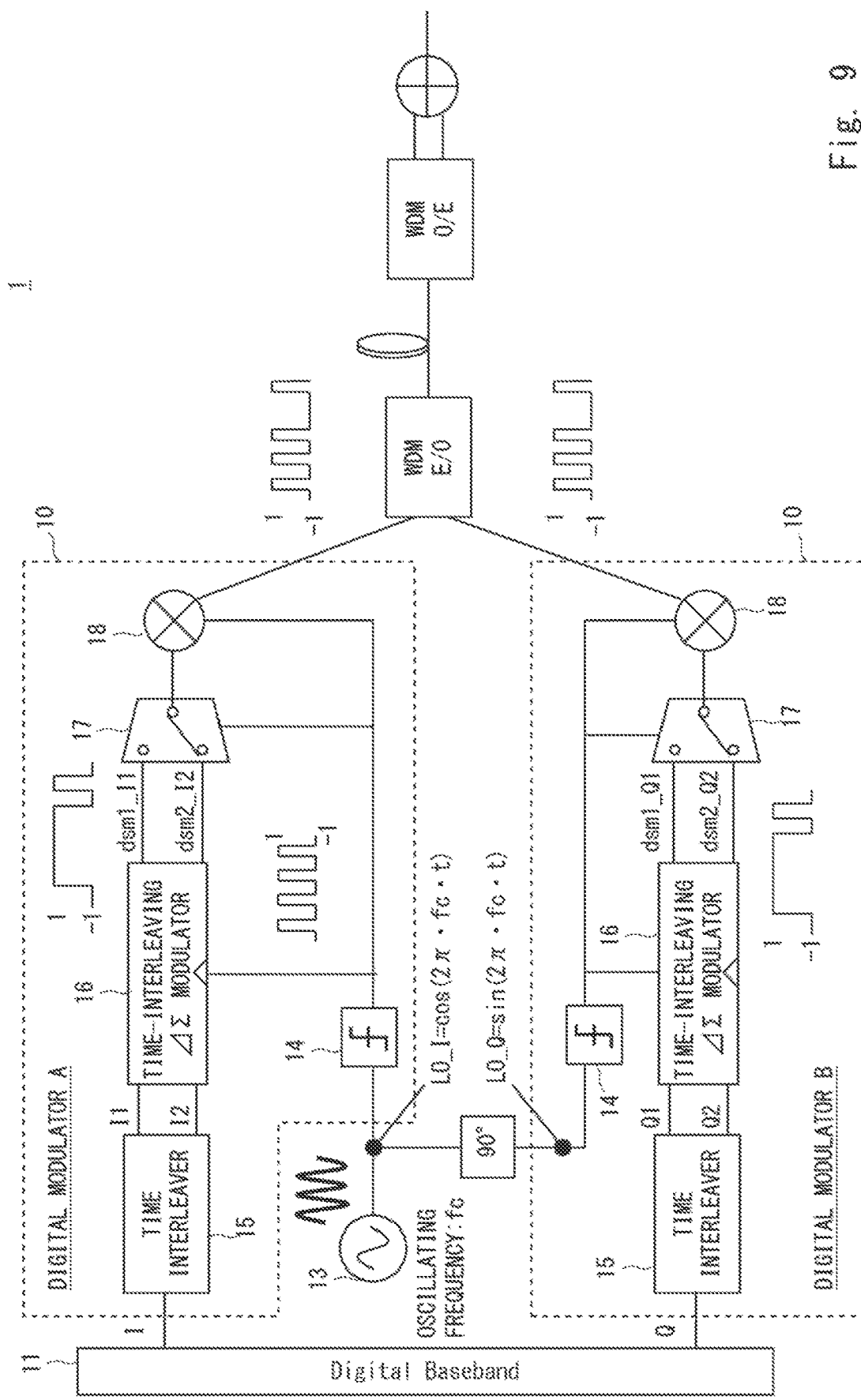
FIG. 9 is a block diagram of a communication device according to a fourth example embodiment of the present disclosure.

A communication device 1 according to a fourth example embodiment is described hereinafter with reference to FIG. 9. FIG. 9 is a block diagram of the communication device 1 according to this example embodiment. In this example embodiment, a digital modulator A and a digital modulator B that share a baseband signal generating unit 11 are included.

A rectangulating unit 14, a time interleaver 15, a time interleaving ΔΣ modulator 16, a selector 17, and a mixer 18 that constitute each of the digital modulators A and B are the same circuits as the circuit blocks of the same name that constitute the second example embodiment shown in FIG. 2, and they are connected in the same manner, and therefore the detailed description thereof is omitted.

In this example embodiment, orthogonal radio signals (I, Q) generated in the baseband signal generating unit 11 are input to the digital modulators A and B, respectively, and converted into pulse signals. Further, an output signal from the RF phase signal generator 13 with an oscillating frequency fc is input to the digital modulator A, and a signal with a phase delay of 90° of the output signal from the same RF phase signal generator 13 is input to the digital modulator B.

Output signals of the digital modulators A and B are combined through fiber transmission using wavelength division multiplexing. An output signal MIXoutA(t) of the digital modulator A is described by the following expression (16) by substituting I(t) for r(t) and cos(ωct)+HmA(t) for RFθr(t) in the expression (15) of MIXout(t) in the second example embodiment. Note that HmA(t) is a harmonic component that is generated when converting the output signal of the RF phase signal generator 13 into a rectangular shape in the digital modulator A. Further, N_TI_A(t) is quantization noise generated in the time interleaving ΔΣ modulator 16 in the digital modulator A.

Expression 16

$$MIXoutA = \{I(t) + N\_TI\_A(t)\}\{\cos(\omega ct) + HmA(t)\} \quad (16)$$
$$= I(t)\cos(\omega ct) + I(t)HmA(t) +$$
$$N\_TI\_A(t)\{\cos(\omega ct) + HmA(t)\}$$

Likewise, an output signal MIXoutB(t) of the digital modulator B is described by the following expression (17) by substituting Q(t) for r(t) and sin(ωct)+HmB(t) for RFθr(t) in the expression (15) of MIXout(t) in the second example embodiment. Note that HmB(t) is a harmonic component that is generated when converting the output signal of the RF phase signal generator 13 into a rectangular shape in the digital modulator B. Further, N_TI_B(t) is quantization noise generated in the time interleaving ΔΣ modulator 16 in the digital modulator B.

Expression 17

$$MIXoutB(t) = \{Q(t) + N\_TI\_B(t)\}\{\sin(\omega ct) + HmB(t)\} \quad (17)$$
$$= Q(t)\sin(\omega ct) + Q(t)HmB(t) +$$
$$N\_TI\_B(t)\{\sin(\omega ct) + HmB(t)\}$$

The combined signal comb(t) after fiber transmission is the sum of MIXoutA(t) and MIXoutB(t), which is described by the following expression (18). According to the expression (18), comb(t) contains a desired RF signal.

Expression 18

$$comb(t) = RF(t) + DN(t) \quad (18)$$
$$RF(t) = I(t)\cos(\omega ct) + Q(t)\sin(\omega ct)$$
$$DN(t) = I(t)HmA(t) + N\_TI\_A(t)\{\cos(\omega ct) + HmA(t)\} +$$
$$Q(t)HmB(t) + N\_TI\_B(t)\{\sin(\omega ct) + HmB(t)\}$$

In this example embodiment, as in the case of using the non-time interleaving ΔΣ modulator, the clock rate of the time interleaving ΔΣ modulator 16 is fc, and the rate of the output signals of the digital modulators A and B is 2 fc. As described earlier, the bandwidth that satisfies the specification in the noise characteristics of the time interleaving ΔΣ modulator 16 is double that when using the non-time interleaving ΔΣ modulator.

As described above, in this example embodiment using the time interleaving ΔΣ modulator 16, the operating bandwidth is double that when using the non-time interleaving ΔΣ modulator.

Fifth Example Embodiment

Figure 10:
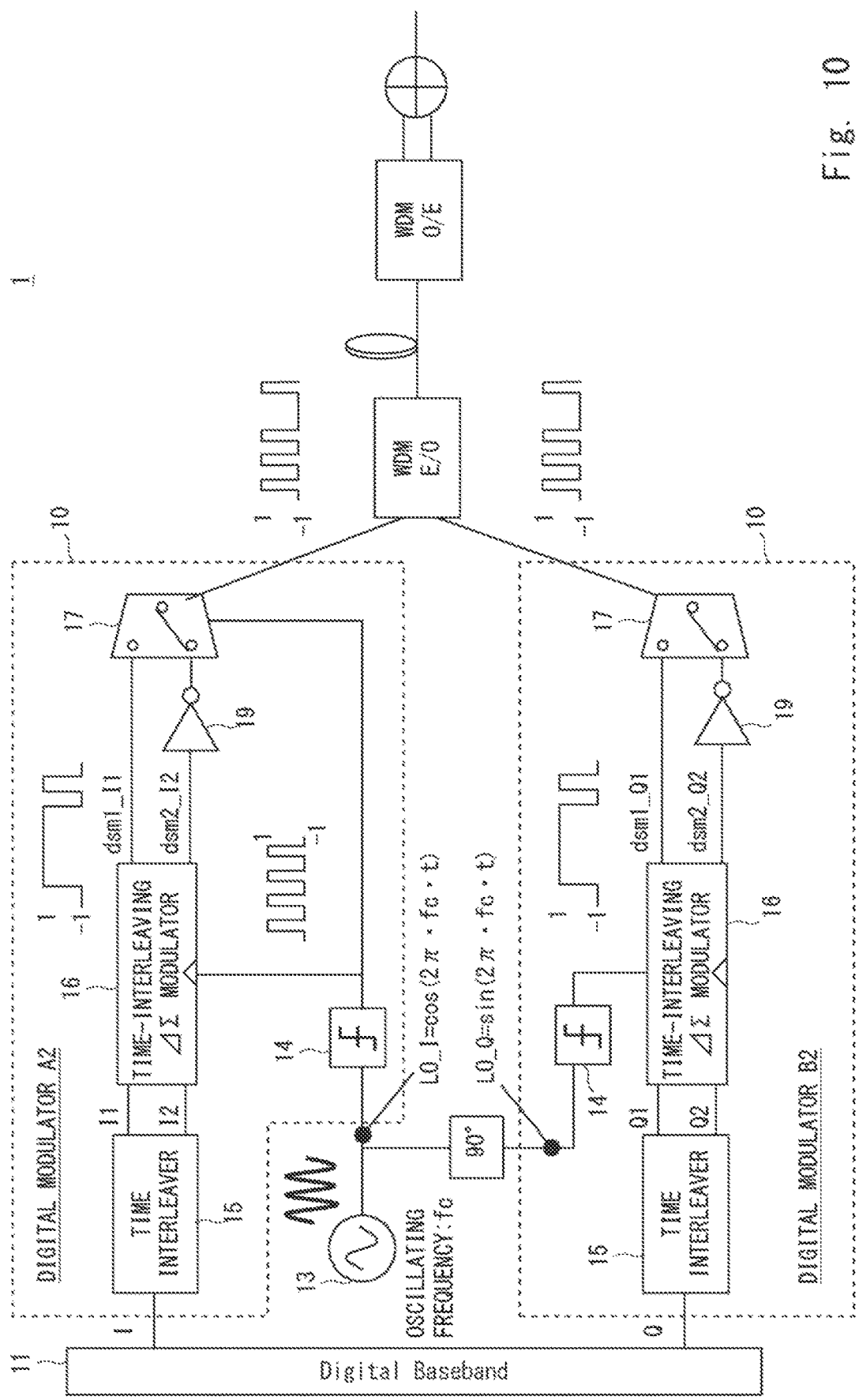
FIG. 10 is a block diagram of a communication device according to a fifth example embodiment of the present disclosure.
Figure 11:
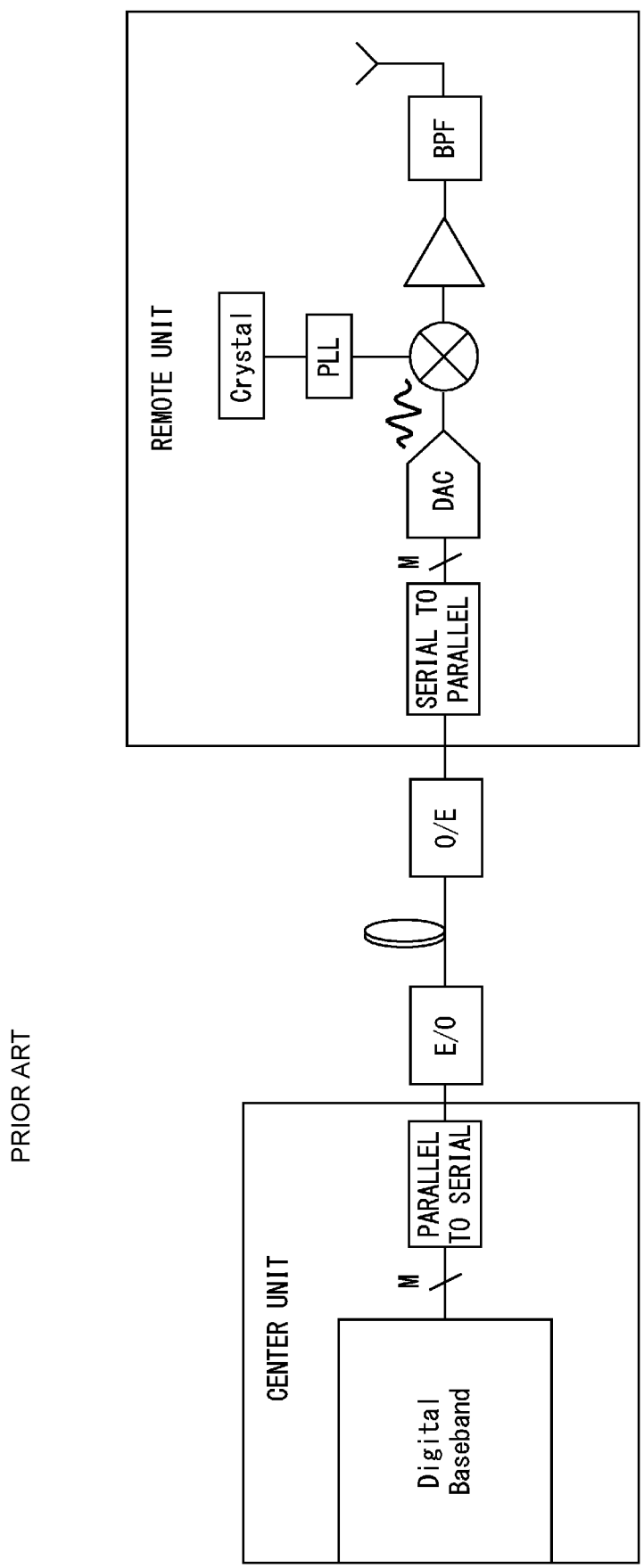
FIG. 11 is a block diagram of a radio access system using an optical fiber according to a related art.

A communication device 1 according to a fifth example embodiment is described hereinafter with reference to FIG. 10. FIG. 10 is a block diagram of the communication device 1 according to this example embodiment. In the communication device 1 according to this example embodiment, the digital modulators A and B used in the fourth example embodiment are replaced by digital modulators A2 and B2, respectively.

A rectangulating unit 14, a time interleaver 15, a time interleaving ΔΣ modulator 16, a selector 17, and an inverting circuit 19 that constitute each of the digital modulators A2 and B2 are the same circuits as the circuit blocks of the same name that constitute the digital modulator 10 in the third example embodiment, and they are connected in the same manner, and therefore the detailed description thereof is omitted.

The signals generated in the digital modulators A2 and B2 are the same as the signals generated in the digital modulators A and B. Thus, in this example embodiment also, the operating bandwidth is double that when using the non-time interleaving ΔΣ modulator, as in the fourth example embodiment shown in FIG. 9. By time interleaving, while the rate of an external clock is fc, the clock frequency of the time-interleaving ΔΣ modulator 16 is quasi doubled. In the expression (1), fs is doubled, and therefore wider signal bandwidth is achieved without degradation of the SN ratio.

Other Example Embodiments

As another example embodiment, the digital modulator 10 according to the present disclosure may have a control method, for example. Specifically, the control method includes a step of generating a phase signal and an amplitude signal from a baseband signal, a step of generating an RF phase signal on the basis of the phase signal, a step of generating a rectangular RF phase signal by converting the RF phase signal into a rectangular shape, a step of time interleaving the amplitude signal and outputting a first interleaved signal and a second time interleaved signal, a step of ΔΣ modulating the first interleaved signal and the second time interleaved signal on the basis of the rectangular RF phase signal and outputting a first ΔΣ modulated signal and a second ΔΣ modulated signal, a step of receiving the first ΔΣ modulated signal and the second ΔΣ modulated signal, and selecting and outputting one of the first ΔΣ modulated signal and the second ΔΣ modulated signal on the basis of the rectangular RF phase signal.

The above-described control method may be implemented by a computer including a CPU (Central Processing Unit), a memory and the like. For example, a program for performing a method according to the example embodiment may be stored in a storage device, and each function may be implemented by executing the program stored in the storage device on the CPU.

The above program is a program that causes the digital modulator 10 to perform processing of generating a phase signal and an amplitude signal from a baseband signal, processing of generating an RF phase signal on the basis of the phase signal, processing of generating a rectangular RF phase signal by converting the RF phase signal into a rectangular shape, processing of time interleaving the amplitude signal and outputting a first interleaved signal and a second time interleaved signal, processing of ΔΣ modulating the first interleaved signal and the second time interleaved signal on the basis of the rectangular RF phase signal and outputting a first ΔΣ modulated signal and a second ΔΣ modulated signal, processing of receiving the first ΔΣ modulated signal and the second ΔΣ modulated signal, and selecting and outputting one of the first ΔΣ modulated signal and the second ΔΣ modulated signal on the basis of the rectangular RF phase signal.

This program can be stored and provided to a computer using any type of non-transitory computer readable medium. Non-transitory computer readable media include any type of tangible storage medium. Examples of the non-transitory computer readable medium include a magnetic storage medium, an optical magnetic storage medium, a CD-ROM, a CD-R, a CD-R/W, and a semiconductor memory. Examples of the semiconductor memory include a mask ROM, a PROM (Programmable ROM), an EPROM (Erasable PROM), a flash ROM, and a RAM. The program may be provided to a computer using any type of transitory computer readable medium. Examples of the transitory computer readable medium include electric signals, optical signals, and electromagnetic waves. The transitory computer readable medium can provide the program to a computer via a wired communication line such as an electric wire or an optical fiber, or a wireless communication line.

As described above, according to the present disclosure, there are provided a digital modulator, a communication device, a digital modulator control method, and a program that achieve wider signal bandwidth with simple components.

Although the present disclosure has been described in detail above with reference to the example embodiments, a specific configuration is not limited to those described above, and various design modifications can be made within the scope of the present disclosure.

The whole or part of the example embodiments disclosed above can be described as, but not limited to, the following supplementary notes.

(Supplementary Note 1)

A digital modulator comprising:
  a polar converter configured to generate a phase signal and an amplitude signal from a baseband signal;
  an RF phase signal generator configured to generate an RF phase signal on the basis of the phase signal;
  a rectangulating unit configured to generate a rectangular RF phase signal by converting the RF phase signal into a rectangular shape;
  a time interleaver configured to time interleave the amplitude signal, and output a first interleaved signal and a second time interleaved signal;
  a ΔΣ modulator configured to ΔΣ modulate the first interleaved signal and the second time interleaved signal on the basis of the rectangular RF phase signal, and output a first ΔΣ modulated signal and a second ΔΣ modulated signal; and
  a selector configured to receive as input the first ΔΣ modulated signal and the second ΔΣ modulated signal, and select and output one of the first ΔΣ modulated signal and the second ΔΣ modulated signal on the basis of the rectangular RF phase signal.

(Supplementary Note 2)

The digital modulator according to Supplementary Note 1, wherein the rectangular RF phase signal is a rectangular wave having a phase difference and an oscillating frequency, the phase difference from an oscillating signal being equal to a phase indicated by the phase signal, on the basis of the oscillating signal serving as a reference for the oscillating frequency generated by the RF phase signal generator and the phase signal.

(Supplementary Note 3)

The digital modulator according to Supplementary Note 1 or 2, wherein the selector selects one of the first ΔΣ modulated signal and the second ΔΣ modulated signal depending on whether the rectangular RF phase signal is high level or low level.

(Supplementary Note 4)

The digital modulator according to any one of Supplementary Notes 1 to 3, wherein the ΔΣ modulator performs ΔΣ modulation of the first interleaved signal and the second time interleaved signal by using the rectangular RF phase signal as a clock signal.

(Supplementary Note 5)

The digital modulator according to any one of Supplementary Notes 1 to 4, further comprising:
  a multiplier configured to multiply one of the first ΔΣ modulated signal and the second ΔΣ modulated signal selected by the selector by the rectangular RF phase signal.

(Supplementary Note 6)

The digital modulator according to any one of Supplementary Notes 1 to 5, further comprising:
  an inverting circuit configured to invert the second ΔΣ modulated signal, wherein the inverted second ΔΣ modulated signal is input to the selector.

(Supplementary Note 7)

A communication device comprising:
  a digital modulator; and
  an optical module configured to perform signal processing on the basis of an output signal of the digital modulator, wherein the digital modulator comprises:
  a polar converter configured to generate a phase signal and an amplitude signal from a baseband signal;
  an RF phase signal generator configured to generate an RF phase signal on the basis of the phase signal;
  a rectangulating unit configured to generate a rectangular RF phase signal by converting the RF phase signal into a rectangular shape;
  a time interleaver configured to time interleave the amplitude signal, and output a first interleaved signal and a second time interleaved signal;
  a ΔΣ modulator configured to ΔΣ modulate the first interleaved signal and the second time interleaved signal on the basis of the rectangular RF phase signal, and output a first ΔΣ modulated signal and a second ΔΣ modulated signal; and
  a selector configured to receive as input the first ΔΣ modulated signal and the second ΔΣ modulated signal, and select and output one of the first ΔΣ modulated signal and the second ΔΣ modulated signal on the basis of the rectangular RF phase signal.

(Supplementary Note 8)

The communication device according to Supplementary Note 7, wherein the rectangular RF phase signal is a rectangular wave having a phase difference and an oscillating frequency, the phase difference from an oscillating signal being equal to a phase indicated by the phase signal, on the basis of the oscillating signal serving as a reference for the oscillating frequency generated by the RF phase signal generator and the phase signal.

(Supplementary Note 9)

The communication device according to Supplementary Note 7 or 8, wherein the selector selects one of the first $\Delta\Sigma$ modulated signal and the second $\Delta\Sigma$ modulated signal depending on whether the rectangular RF phase signal is high level or low level.

(Supplementary Note 10)

The communication device according to any one of Supplementary Notes 7 to 9, wherein the $\Delta\Sigma$ modulator performs $\Delta\Sigma$ modulation of the first interleaved signal and the second time interleaved signal by using the rectangular RF phase signal as a clock signal.

(Supplementary Note 11)

The communication device according to any one of Supplementary Notes 7 to 10, further comprising:
- a multiplier configured to multiply one of the first $\Delta\Sigma$ modulated signal and the second $\Delta\Sigma$ modulated signal selected by the selector by the rectangular RF phase signal.

(Supplementary Note 12)

The communication device according to any one of Supplementary Notes 7 to 11, wherein the digital modulator further comprises an inverting circuit configured to invert the second $\Delta\Sigma$ modulated signal, and inputs the inverted second $\Delta\Sigma$ modulated signal to the selector.

(Supplementary Note 13)

A digital modulator control method comprising:
- a step of generating a phase signal and an amplitude signal from a baseband signal;
- a step of generating an RF phase signal on the basis of the phase signal;
- a step of generating a rectangular RF phase signal by converting the RF phase signal into a rectangular shape;
- a step of time interleaving the amplitude signal, and outputting a first interleaved signal and a second time interleaved signal;
- a step of $\Delta\Sigma$ modulating the first interleaved signal and the second time interleaved signal on the basis of the rectangular RF phase signal, and outputting a first $\Delta\Sigma$ modulated signal and a second $\Delta\Sigma$ modulated signal; and
- a step of inputting the first $\Delta\Sigma$ modulated signal and the second $\Delta\Sigma$ modulated signal, and selecting and outputting one of the first $\Delta\Sigma$ modulated signal and the second $\Delta\Sigma$ modulated signal on the basis of the rectangular RF phase signal.

(Supplementary Note 14)

The digital modulator control method according to Supplementary Note 13, wherein the rectangular RF phase signal is a rectangular wave having a phase difference and an oscillating frequency, the phase difference from an oscillating signal being equal to a phase indicated by the phase signal, on the basis of the oscillating signal serving as a reference for the oscillating frequency generated by the RF phase signal generator and the phase signal.

(Supplementary Note 15)

The digital modulator control method according to Supplementary Note 13 or 14, further comprising:
- a step of multiplying one of the first $\Delta\Sigma$ modulated signal and the second $\Delta\Sigma$ modulated signal by the rectangular RF phase signal.

(Supplementary Note 16)

A program causing a digital modulator to perform:
- processing of generating a phase signal and an amplitude signal from a baseband signal;
- processing of generating an RF phase signal on the basis of the phase signal;
- processing of generating a rectangular RF phase signal by converting the RF phase signal into a rectangular shape;
- processing of time interleaving the amplitude signal, and outputting a first interleaved signal and a second time interleaved signal;
- processing of $\Delta\Sigma$ modulating the first interleaved signal and the second time interleaved signal on the basis of the rectangular RF phase signal, and outputting a first $\Delta\Sigma$ modulated signal and a second $\Delta\Sigma$ modulated signal; and
- processing of inputting the first $\Delta\Sigma$ modulated signal and the second $\Delta\Sigma$ modulated signal, and selecting and outputting one of the first $\Delta\Sigma$ modulated signal and the second $\Delta\Sigma$ modulated signal on the basis of the rectangular RF phase signal.

(Supplementary Note 17)

The program according to Supplementary Note 16, wherein the rectangular RF phase signal is a rectangular wave having a phase difference and an oscillating frequency, the phase difference from an oscillating signal being equal to a phase indicated by the phase signal, on the basis of the oscillating signal serving as a reference for the oscillating frequency generated by the RF phase signal generator and the phase signal.

(Supplementary Note 18)

The program according to Supplementary Note 16 or 17, further comprising:
- processing of multiplying one of the first $\Delta\Sigma$ modulated signal and the second $\Delta\Sigma$ modulated signal by the rectangular RF phase signal.

The first and fifth embodiments can be combined as desirable by one of ordinary skill in the art.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

What is claimed is:

1. A digital modulator comprising:
- a polar converter configured to generate a phase signal and an amplitude signal from a baseband signal;
- an RF phase signal generator configured to generate an RF phase signal on the basis of the phase signal;
- a rectangulating unit configured to generate a rectangular RF phase signal by converting the RF phase signal into a rectangular shape;
- a time interleaver configured to time interleave the amplitude signal, and output a first interleaved signal and a second time interleaved signal;
- a $\Delta\Sigma$ modulator configured to $\Delta\Sigma$ modulate the first interleaved signal and the second time interleaved signal on the basis of the rectangular RF phase signal, and output a first ΔΣ modulated signal and a second ΔΣ modulated signal; and a selector configured to receive as input the first ΔΣ modulated signal and the second ΔΣ modulated signal, and select and output one of the first ΔΣ modulated signal and the second ΔΣ modulated signal on the basis of the rectangular RF phase signal.

2. The digital modulator according to claim 1, wherein the rectangular RF phase signal is a rectangular wave having a phase difference and an oscillating frequency, the phase difference from an oscillating signal being equal to a phase indicated by the phase signal, on the basis of the oscillating signal serving as a reference for the oscillating frequency generated by the RF phase signal generator and the phase signal.

3. The digital modulator according to claim 1, wherein the selector selects one of the first ΔΣ modulated signal and the second ΔΣ modulated signal depending on whether the rectangular RF phase signal is high level or low level.

4. The digital modulator according to claim 1, wherein the ΔΣ modulator performs ΔΣ modulation of the first interleaved signal and the second time interleaved signal by using the rectangular RF phase signal as a clock signal.

5. The digital modulator according to claim 1, further comprising:
a multiplier configured to multiply one of the first ΔΣ modulated signal and the second ΔΣ modulated signal selected by the selector by the rectangular RF phase signal.

6. The digital modulator according to claim 1, further comprising:
an inverting circuit configured to invert the second ΔΣ modulated signal,
wherein the inverted second ΔΣ modulated signal is input to the selector.

7. A communication device comprising:
a digital modulator; and
an optical module configured to perform signal processing on the basis of an output signal of the digital modulator,
wherein the digital modulator comprises:
a polar converter configured to generate a phase signal and an amplitude signal from a baseband signal;
an RF phase signal generator configured to generate an RF phase signal on the basis of the phase signal;
a rectangulating unit configured to generate a rectangular RF phase signal by converting the RF phase signal into a rectangular shape;
a time interleaver configured to time interleave the amplitude signal, and output a first interleaved signal and a second time interleaved signal;
a ΔΣ modulator configured to ΔΣ modulate the first interleaved signal and the second time interleaved signal on the basis of the rectangular RF phase signal, and output a first ΔΣ modulated signal and a second ΔΣ modulated signal; and
a selector configured to receive as input the first ΔΣ modulated signal and the second ΔΣ modulated signal, and select and output one of the first ΔΣ modulated signal and the second ΔΣ modulated signal on the basis of the rectangular RF phase signal.

8. The communication device according to claim 7, wherein the rectangular RF phase signal is a rectangular wave having a phase difference and an oscillating frequency, the phase difference from an oscillating signal being equal to a phase indicated by the phase signal, on the basis of the oscillating signal serving as a reference for the oscillating frequency generated by the RF phase signal generator and the phase signal.

9. The communication device according to claim 7, wherein the selector selects one of the first ΔΣ modulated signal and the second ΔΣ modulated signal depending on whether the rectangular RF phase signal is high level or low level.

10. The communication device according to claim 7, wherein the ΔΣ modulator performs ΔΣ modulation of the first interleaved signal and the second time interleaved signal by using the rectangular RF phase signal as a clock signal.

11. The communication device according to claim 7, further comprising:
a multiplier configured to multiply one of the first ΔΣ modulated signal and the second ΔΣ modulated signal selected by the selector by the rectangular RF phase signal.

12. The communication device according to claim 7, wherein the digital modulator further comprises an inverting circuit configured to invert the second ΔΣ modulated signal, and inputs the inverted second ΔΣ modulated signal to the selector.

13. A digital modulator control method comprising:
generating a phase signal and an amplitude signal from a baseband signal;
generating an RF phase signal on the basis of the phase signal;
generating a rectangular RF phase signal by converting the RF phase signal into a rectangular shape;
time interleaving the amplitude signal, and outputting a first interleaved signal and a second time interleaved signal;
ΔΣ modulating the first interleaved signal and the second time interleaved signal on the basis of the rectangular RF phase signal, and outputting a first ΔΣ modulated signal and a second ΔΣ modulated signal; and
inputting the first ΔΣ modulated signal and the second ΔΣ modulated signal, and selecting and outputting one of the first ΔΣ modulated signal and the second ΔΣ modulated signal on the basis of the rectangular RF phase signal.

14. The digital modulator control method according to claim 13, wherein the rectangular RF phase signal is a rectangular wave having a phase difference and an oscillating frequency, the phase difference from an oscillating signal being equal to a phase indicated by the phase signal, on the basis of the oscillating signal serving as a reference for the oscillating frequency generated by the RF phase signal generator and the phase signal.

15. The digital modulator control method according to claim 13, wherein the selecting selects one of the first ΔΣ modulated signal and the second ΔΣ modulated signal depending on whether the rectangular RF phase signal is high level or low level.

16. The digital modulator control method according to claim 13, wherein the ΔΣ modulating performs ΔΣ modulation of the first interleaved signal and the second time interleaved signal by using the rectangular RF phase signal as a clock signal.

17. The digital modulator control method according to claim 13, further comprising:
multiplying the selected one of the first ΔΣ modulated signal and the second ΔΣ modulated signal by the rectangular RF phase signal.

18. The digital modulator control method according to claim 13, wherein the selecting includes inverting the second ΔΣ modulated signal, and the inverted second ΔΣ modulated signal is input.

* * * * *